United States Patent [19]

Swart et al.

[11] Patent Number: 4,983,909
[45] Date of Patent: Jan. 8, 1991

[54] REPETITIVE-SWITCHING

[75] Inventors: Mark A. Swart, Upland; Charles J. Johnston, Walnut, both of Calif.

[73] Assignee: Everett/Charles Contact Products, Inc., Pomona, Calif.

[21] Appl. No.: 442,289

[22] Filed: Nov. 28, 1989

[51] Int. Cl.⁵ ............................................. G01R 1/06
[52] U.S. Cl. ................................ 324/158 P; 439/482; 324/72.5; 324/158 F; 200/61.76
[58] Field of Search ............... 324/72.5, 158 P, 158 F, 324/149; 439/481, 482, 824; 200/16 B, 61.76, 61.79, 61.80, 318, 51.07, 51.08, 51.09, 43.61, 51.13

[56] References Cited

U.S. PATENT DOCUMENTS

| | | |
|---|---|---|
| 3,939,414 | 2/1976 | Roch . |
| 4,050,762 | 9/1977 | Hines et al. . |
| 4,263,547 | 4/1981 | Johnson . |
| 4,394,620 | 7/1983 | Montalto et al. ................... 324/149 |
| 4,464,623 | 8/1984 | Chambon . |
| 4,481,146 | 11/1984 | Alexandersen et al. . |
| 4,492,833 | 1/1985 | Malesko ......................... 280/61.76 |
| 4,667,154 | 5/1987 | Albertson et al. ................. 324/72.5 |
| 4,904,213 | 2/1990 | Hock et al. ......................... 439/482 |

Primary Examiner—Ernest F. Karlsen
Assistant Examiner—William J. Burns
Attorney, Agent, or Firm—Christie, Parker & Hale

[57] ABSTRACT

A breakaway switch probe comprises an outer barrel, a movable plunger in one end portion of the barrel, a terminal projecting from the other end of the barrel, and a breakaway clip mounted on the barrel and normally engaging a contact surface on the plunger for retaining the plunger in its at-rest position, substantially immovable in the barrel and out of contact with a switch point on the terminal. The plunger is normally retained in its at-rest position spaced from the switch point so that absence of contact between the plunger and the switch point produces an electrical open-circuit condition in electrical test circuitry connected to the probe. An external test force of less than the preset level applied to the plunger in opposition to the resistance force of the breakaway clip will not move the plunger from its at-rest position, thereby retaining the open-circuit test indication. The breakaway clip is movable away from its engagement with the contact surface of the plunger when the external test force applied to it exceeds the threshold level, and the movement of the breakaway clip away from the plunger contact surface releases the plunger for travel in the barrel toward and into contact with the switch point to produce a closed-circuit condition in the electrical test circuit connected to the switch probe.

6 Claims, 1 Drawing Sheet

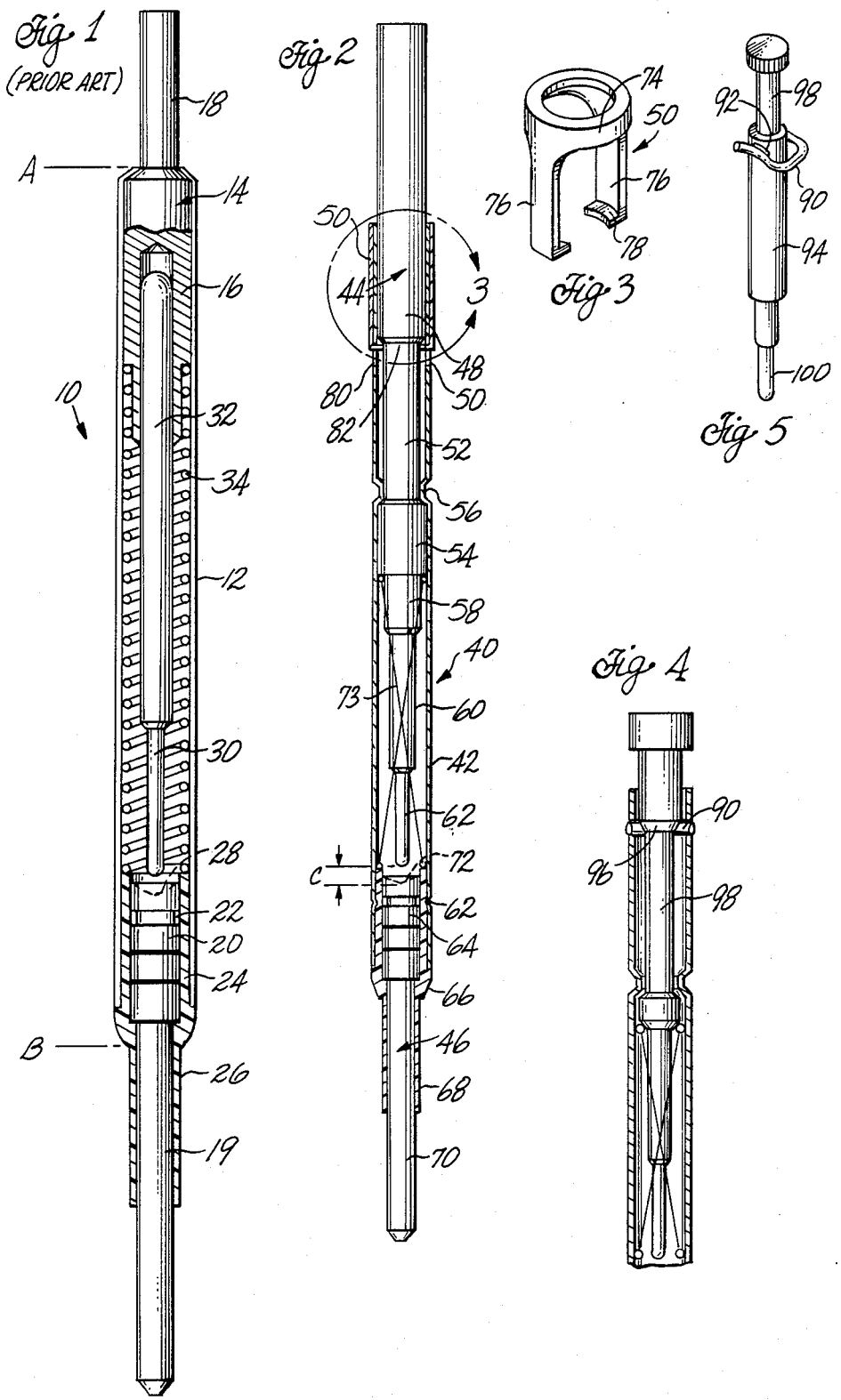

REPETITIVE-SWITCHING

FIELD OF THE INVENTION

This invention relates to electrical contact test probes, and more particularly to spring-loaded test probes for use in electrical testing of a variety of electrical devices. These probes are generally used to produce electrical contact between an electrical device under test and electrical diagnostic or testing equipment.

BACKGROUND OF THE INVENTION

In the automatic testing of electrical circuits, test probes of various configurations are used, depending upon the type of electrical device under test. A type of test probe commonly referred to as a "switch probe" is used in the automatic electrical continuity testing of electrical equipment such as cable harnesses for automobiles. Switch probes have been used in the past by pressing each probe into contact with a corresponding electrical terminal on the cable harness. Typically, these cable harnesses can have a large number of closely spaced terminals, and a large number of switch probes are mounted to a test head which "cycles" the switch probes in unison to make contact with the terminals with a rapid up-down motion.

A relatively large push out force is applied to each cable harness terminal by the switch probes during each cycle. If the terminal is not seated properly in the cable harness, the terminal is pushed out of the way by the probe, and this prevents the switch from closing. This produces an open circuit in the tester, indicating that the terminal was not seated or mounted properly. On the other hand, if the terminal is mounted properly in the harness, the pressure applied by the switch probe to the terminal during the cycle causes the switch probe plunger to travel far enough to close the switch. This automatically produces a closed circuit in the tester, indicating that the cable harness terminal has been seated or mounted properly.

A typical switch probe is a miniature-sized device which includes an outer barrel, a terminal at one end of the barrel, a movable plunger projecting from the opposite end of the barrel, and a coil spring inside the barrel between the plunger and the terminal. A downward force applied to the plunger against the bias of the spring moves the plunger toward a switch point on the terminal inside the probe. The force applied under test is controlled by the spring constant of the coil spring. If the cable harness is faulty, maximum design force is not reached and the plunger does not close the switch. If the cable harness terminal is wired properly, the maximum design force is reached and the plunger contacts the switch point.

These switch probes are subjected to an extreme amount of abuse because they are constantly cycled at rapid intervals for testing millions of cable harness terminals. Since the terminals under test can be closely spaced apart, they require switch probes of miniature size. Cable harness testing typically requires probes spaced apart by a distance of about one-tenth inch on-center, for example. In one prior art switch probe, the diameter of each probe is about 0.080 inch; another prior art switch probe has a diameter of about 0.125 inch. Cable harness testing also requires a reasonably high push out force, given the size of the probe, the force generally being in the range of 4 to 12 pounds applied over a relatively short distance. Typically, the probes are moved only about 1/10 inch during each cycle.

It is difficult to manufacture coil-type compression springs of the required miniature size for switch probes designed to control the relatively large amount of spring force applied during testing, while also maintaining the necessary reliable operation from cycle-to-cycle over an extremely large number of operating cycles. Probe travel inside the switch probe is particularly critical. If the probe has a slight amount of overtravel or undertravel, for example, the amount of spring force applied to the cable harness terminal changes; and tolerances in the probe spring are difficult to control for a small-sized spring. Fixture tolerances also add to the problem of producing the desired spring force on the cable harness terminal with the conventional spring probe.

SUMMARY OF THE INVENTION

The present invention provides a "repetitive-switching" switch probe which replaces use of the internal coil spring for controlling the travel distance and maximum force applied by the switch probe during each test cycle. The repetitive-switching probe includes an outer barrel, a movable plunger projecting from one end of the barrel, and a terminal at the opposite end of the barrel. Internal movement of the plunger in the barrel is toward and away from an internal point on the terminal. If plunger travel is far enough, contact is made and the switch is closed. Plunger travel is controlled by a repetitive-switching spring clip engaging a cooperating control surface on the movable plunger. Force applied to the plunger during each test cycle increases until the force reaches a preset threshold force, at which point the spring clip "breaks away" and allows the plunger to travel sufficiently for making contact with the switch point on the terminal. This travel is under a low applied force, much lower than the threshold force. Thus, the probe only cycles after the plunger is subjected to an initial critical push out force of a preset level, controlled exclusively by the spring clip's contact with the control surface on the plunger. The switch probe can include an internal compression spring or the like engaging the movable plunger and functioning as a return spring for the plunger. When the test force is released, the spring in the barrel returns the plunger to its at-rest position, and the repetitive-switching clip also returns automatically to its initial position in contact with the control surface on the probe, ready for the next cycle.

Thus, the movable plunger does not cycle until the preset threshold force is reached, to first release the repetitive-switching spring clip. The operation is digital: the test force is applied and only when it reaches the preset critical threshold level, then the plunger moves under the applied force to close the switch; but if the test force is below the preset threshold level (such as when the probe contacts a faulty cable harness terminal), the repetitive-switching clip prevents the switch plunger from moving, thereby keeping the switch open. This avoids the prior art practice of constantly applying downward cycling forces to the compression spring to control cycling distance and pressure during each cycle. The precise contact force applied during each cycle is controlled according to the present invention by controlling the resistance force applied by the repetitive-switching clip to the plunger. The more digital-like cycling of the test probe (there is no movement of the probe until the necessary preset contact force is applied to the probe) avoids the wear and tear of the compression springs, used in the prior art switch probes. The repetitive-switching clip also can be made in the required miniature sizes, and since it is difficult to generate the large compression forces (in the range of about 4 to 12 pounds) with a small compression spring cycled at high frequencies, further problems associated with the prior art use of compression springs for control cycling the switch probe are voided.

These and other aspects of the invention will be more fully understood by referring to the following detailed description and the accompanying drawings.

BRIEF DESCRIPTION OF THE DRAWINGS

FIG. 1 is a cross sectional view illustrating a prior art switch probe.

FIG. 2 is a cross sectional view illustrating one embodiment of the repetitive-switching switch probe according to principles of the invention.

FIG. 3 is an enlarged perspective view illustrating a repetitive-switching clip portion of the probe shown within the line 3—3 of FIG. 2.

FIG. 4 is a cross sectional view illustrating an alterative embodiment of the repetitive-switching switch probe.

FIG. 5 is a perspective view of the repetitive-switching switch probe shown in FIG. 4.

DETAILED DESCRIPTION

FIG. 1 illustrates a prior art switch probe 10 which is commonly used for testing the terminals of cable harnesses. The prior art switch probe is described here to provide a better understanding of the improvements provided by the present invention. The prior art switch probe 10 includes an elongated tubular outer barrel 12 and a movable plunger 14 slidably mounted inside the hollow interior of the outer barrel. The plunger 14 includes an elongated bearing portion 16 which slidably engages the interior surface of the barrel, and a narrow elongated plunger tip 18 projecting through an end of the barrel to the exterior of the switch probe. Both the barrel and the plunger are generally circular in cross-section and are made from an electrically conductive material.

A narrow, elongated fixed probe terminal 19 projects out from the opposite end of the barrel. The terminal 19 has an enlarged internal contact member 20 engaged with the inside wall of the barrel for retaining the terminal in a fixed position within the end of the barrel. A cooperating shoulder and groove at 22 are typically used for fixing the terminal 19 to the end of the barrel. The terminal 19 is electrically isolated from the barrel 12 by a large sleeve-like insulator 24 surrounding the contact member 20. The insulator narrows down to an elongated sleeve-like insulator 26 surrounding the exterior narrow elongated end portion 19 of the probe terminal. The contact member 20 of the terminal 19 further includes a recessed contact surface 28, which provides an electrical switch point internally within the barrel for switching engagement with a contact tip 30 of the plunger.

The plunger 14 further includes an elongated shaft 32 which is press-fitted into an end of the plunger bearing 16. The plunger shaft 32 extends axially through the barrel for about one-half the overall length of the barrel. The contact tip 30 of the plunger is at the free end of the shaft and moves axially in the barrel in response to axial travel of the plunger in the barrel. The plunger is shown in its at-rest position in which the contact tip 30 of the plunger is spaced from the switch point on the contact surface 28 of the terminal.

An elongated coil spring 34 is disposed within the barrel between the plunger bearing 16 and the insulating sleeve 24 that surrounds the contact member 20 of the terminal. Plunger travel axially into the barrel is against the normal bias of the control spring, which compresses the spring during its travel. The spring constant of the control spring controls the amount of force necessary to move the plunger through the distance to the switch point of the probe. That is, an external test force applied to the plunger causes the plunger to travel in the barrel so the contact tip 30 of the plunger moves toward the switch point on the contact surface 28. The amount of force required to move the plunger tip over the critical distance against the bias of the spring is controlled by the spring constant.

The contact tip 19 of the terminal is typically wire-wrapped with a first electrical conductor (not shown) for providing a first electrical lead between the switch probe and electrical test circuitry (not shown) external to the probe. The conductive outer barrel of the probe is commonly connected electrically to a second electrical lead (not shown) also connected to the external test circuitry.

During use, the end of the plunger makes electrical contact with the electrical terminal of a cable harness, for example. This contact with the cable harness terminals is applied under a predetermined force in order to test whether the terminals of the cable harness are properly seated. During testing, a large number of switch probes are mounted to a test fixture (not shown), which cycles rapidly to engage multiple cable harness terminals during each cycle. The ends of the plungers are brought into pressure contact with the cable harness terminals to produce an electrical circuit through each of the test probes only if each cable harness terminal under test is properly seated in the harness. In the testing of cable harnesses, the test points are located very close to one another, for example, they can be spaced about 0.1 inch apart. The push out force applied by the switch probes also is relatively high, say on the order of about 4 to 12 pounds. It is for such testing that the repetitive-switching switch probe of this invention is particularly useful. The present invention overcomes the difficulty in producing a reliable switch probe in which a compression spring that applies such a large amount of contact force also must be contained within such a small probe receptacle. For instance, in the illustrated embodiment, the outer barrel has a diameter of about 0.125 inch, and the length of the barrel from point A to point B is about 1.4 inch, and the overall length of the probe from tip to tip is about 2.23 inches. Tolerances in the spring constant are difficult to maintain within a critical range for such a long, small-diameter control spring, particularly in view of the constant cycling of the spring during testing. Spring rate and travel distance also can vary from probe to probe. Fixture tolerances also add to the problem of controlling a critical spring force on the cable harness terminal. Therefore, switch probes of this type are difficult to design to maintain a constant force from probe to probe.

FIGS. 2, and 3 illustrate one embodiment of a repetitive-switching probe 40 according to this invention. The repetitive-switching spring probe 40 includes a cylindrical outer barrel 42 having a movable plunger 44 projecting from one end and a narrow elongated terminal 46 projecting from an opposite end of the barrel. The plunger 44 includes a cylindrical first bearing 48 seated inside the barrel and adapted to slide axially along the inside wall of the barrel when the plunger travels in the barrel. A repetitive-switching clip 50 (described in more detail below) is affixed to the barrel and a portion of the clip engages the plunger bearing 48 and normally retains the plunger in its at-rest position illustrated in FIG. 2. The plunger further includes a reduced-diameter plunger shaft 52 extending axially along the barrel interior away from the bearing 48. The outside diameter of the plunger is then stepped up to form a second plunger bearing 54 at the end of the shaft 52. A crimped portion of the barrel forms a shoulder 56 which projects into the interior of the barrel to form an annular plunger stop engaging an annular upper shoulder of the second bearing near the midpoint of the switch probe. A plunger terminal of composite configuration extends axially along the barrel interior from the second bearing 54 toward the switch terminal 46. The plunger terminal includes a short reduced-diameter portion 58 adjacent the second bearing, a narrow intermediate shaft portion 60, and an elongated, narrower plunger tip 62 at the free end of the plunger.

The switch terminal 46 has a fixed cylindrical contact member 64 seated in an inside end portion of the barrel opposite from the movable plunger. A crimped portion 65 of the barrel affixes the contact member inside the barrel. A cylindrical insulating sleeve 66 is affixed to the inside wall of the barrel and surrounds the contact member 64 of the switch terminal. The insulating sleeve is necked down at 68 and protrudes outside the barrel and surrounds a portion of a narrow, elongated terminal shaft 70.

During use of the repetitive-switching switch probe, a first electrical conductor can be wire-wrapped to the terminal 70 to form one lead of the switching circuit, and a second electrical conductor can be electrically connected to the barrel 42 of the probe for forming a second lead of the switching circuit. A recessed surface 72 in the face of the contact member of the terminal provides a switch point for engagement with the tip of the plunger 62 during use.

The repetitive-switching probe also includes a return spring (shown schematically at 73) in the form of a coil spring having one end bearing 54 against the second bearing of the plunger and its opposite end bearing against an annular face of the insulating sleeve 66. Axial movement of the plunger 44 from its at-rest position toward the switch terminal 46 causes the plunger tip to travel a distance C to the switch point on the switch terminal surface 72. Contact between the plunger tip and the switch point closes the electrical circuit to which the repetitive-switching switch probe is wired.

Plunger travel is controlled by the repetitive-switching clip 50, shown best in FIG. 3, which comprises a ring 74 seated at the end of the barrel adjacent the large-diameter first bearing portion 48 of the plunger. The clip further includes a pair of elongated fingers 76 in the form of cantilever beams projecting axially from the ring portion of the clip along opposite sides of the barrel. The free ends of the fingers on the repetitive-switching clip have short inwardly projecting tips 78 which form cam followers that project into the interior of the barrel through corresponding slotted openings 80 in the opposite sides of the barrel. The fingers of the clip normally are spring biased inwardly toward the barrel and the ends of the cam followers have angled cam surfaces in spring pressure contact with an annular cam surface 82 on the plunger bearing 48. The back angles of the cam surfaces substantially match the angle of the plunger cam surface. In a preferred embodiment, the angles of the cam followers and the cam surface of the plunger are about 75° with respect to a horizontal plane through the cam surface.

During use, an axial push out force applied to the plunger in the direction toward the repetitive-switching clip causes the cam surface on the plunger to apply axial pressure to the cam followers on the fingers of the repetitive-switching clip. As long as this axial force applied by the plunger is less than a certain preset threshold level, controlled by characteristics of the repetitive-switching clip, the cam followers on the clip will remain engaged with the underside of the plunger cam surface and prevent the plunger from moving axially in the barrel. However, if the axial force applied to the plunger against the cam followers of the repetitive-switching clip exceeds a selected threshold level, the fingers of the repetitive-switching clip spread apart under the downward force exerted by the plunger, pushing the fingers of the clip out of the slotted openings 80, and causing the cam surface of the plunger to bypass the resistance of the repetitive-switching clip and thereby free the plunger for axial travel into the barrel. During axial travel into the barrel, the cam surfaces on the ends of the spring clip ride on the outer surface of the plunger bearing 48. The force applied to the plunger after it breaks away from the resistance provided by the repetitive-switching clip causes the plunger to travel the distance C and into contact with the switch point on the switch terminal for closing the switch. The force applied during travel is much lighter than the threshold level of the push out force. For a probe having a repetitive-switching force of about four pounds, the travel force can be about two to four ounces. When the axial force on the plunger is released, the return spring 73 forces the plunger back toward its at-rest position against the stop at 56 on the barrel. As the cam surface of the plunger slides past the tips of the repetitive-switching clip, the cam surfaces at the tips of the clip are urged into the slotted openings at the side of the barrel and into contact with the underside of the cam surface of the plunger in readiness for the next cycle.

The repetitive-switching switch probe can be used for testing the electrical terminals of a cable harness, as, one, example of its use. A number of the repetitive-switching probes are mounted to a common fixture such as a cable harness block (not shown). The switch probes are rigidly affixed to the fixture for holding the switch probes in an upright position, with the plungers of the switch probes aligned with corresponding cable harness terminals under test. The fixture is then actuated to raise the switch probes in unison so the plungers can apply a push out force to the cable harness terminals. If the cable harness terminals are not properly seated in the cable harness, the plungers contacting any such terminal push the terminal out of the way and, as a result, the force applied to the plunger is insufficient to overcome the repetitive-switching clip and move the plunger internally within the barrel a sufficient distance to close the switch. On the other hand, if the terminal is properly seated in the cable harness, the plunger contacts the terminal under a threshold force controlled by the probe. This force applied to the plunger acts downwardly on the repetitive-switching clip to apply sufficient force to overcome the resistance of the clip to thereby allow the plunger to then move a sufficient distance under lighter force to close the switch. The properly seated cable harness terminal does not move out of the way and therefore remains in place to apply the critical amount of axial force to depress the plunger into the probe to close the switch.

The repetitive-switching clip allows the probe to act as a digital test device in which the preset threshold force must first be applied to the plunger, against the resistance of the repetitive-switching clip to make the mechanical test before the clip releases and allows the plunger to then travel into contact with the switch point separately for the electrical test. If the test probe senses any cable harness terminal that is defective and pushes the terminal out of the way, the force applied to the plunger is less than the threshold force, and the repetitive-switching clip maintains the resistance force on the plunger sufficient to keep the plunger immovable in the barrel during the test cycle. Thus, there is no movement of the plunger in the barrel except when a properly seated cable harness terminal is sensed, and only then does the plunger move to actuate the switch to close the circuit.

The digital functioning of the repetitive-switching clip is controlled by proper adjustment of the stiffness of the fingers on the clip and the cooperating cam angle between the cam surface of the plunger and the cam followers in contact with it. In normal operation, it takes about two pounds of force acting axially on the plunger to generate a few ounces of sideways force on the fingers of the spring clip sufficient to push the fingers off the repetitive-switching clip out of the way to release movement of the plunger.

Use of the breakaway clip provides a substantially more accurate means for precisely controlling the threshold force necessary to actuate the plunger than is possible with the coil spring of the prior art switch probe. Therefore, the breakaway probe overcomes the many serious disadvantages of the prior art switch probe which has been described previously.

FIGS. 4 and 5 illustrate an alternative repetitive-switching probe similar in configuration to the repetitive-switching prove of FIGS. 2 and 3, except that the repetitive-switching clip has been modified and is in the form of the U-shaped clip 90. In this embodiment, the opposite legs of the U-shaped clip fit through slotted openings 92 which extend circumferentially along opposite sides of the barrel 94. The opposite legs of the repetitive-switching clip apply spring pressure to an annular angled cam surface 96 on the plunger 98. The probe includes the probe terminal 100 wired to the electrical test circuitry. A downward force applied to the plunger against the legs of the repetitive-switching clip allows the plunger to overcome the resistance force of the clip only when the axial force on the plunger exceeds a preset threshold force sufficient to force the opposite legs of the clip out of their position in the grooves 92 in the sides of the probe. The inward spring force of the clip and the angle of the cam surface 96 control the preset threshold force of the spring probe.

An advantage of the spring clip embodiment of FIGS. 2 and 3 is that the vertical legs 76 of the clip 50, which extend parallel to the axis of the probe, can be longer and therefore provide a lower spring rate. The legs on the clip 90 are spaced apart approximately by the diameter of the probe and this shorter effective length lowers the spring rate. The legs 76 of the clip 50 can be much longer than the diameter of the probe and therefore can be designed with a lower spring rate.

Thus, the repetitive-switching probe of this invention overcomes the disadvantages associated with switch probes using a coil spring as a means for controlling the force applied to the switch to close the switch during each cycle. Threshold force is more accurately controlled, and the switch probe is more reliable in long-term operation since less cycling is required of the movable plunger.

What is claimed is:

1. A repetitive-switching switch probe comprising:
   an outer barrel;
   a movable plunger in one end portion of the barrel;
   a terminal projecting from an opposite end of the barrel;
   means for retaining the plunger in an at-rest position spaced from a switch point on the terminal so that absence of contact between the plunger and the switch point produces an electrical open circuit condition in an electrical test circuit connected to the switch probe; and
   a repetitive-switching clip on the barrel and normally engaging a contact surface on the plunger for retaining the plunger in its at-rest position, substantially immovable in the barrel and out of contact with the switch point on the terminal;
   the repetitive-switching clip retaining the plunger in its at-rest position by a resistance force of a preset threshold level applied to the plunger contact surface by the clip, so that an external test force of less than said threshold level applied to the plunger in opposition to the resistance force applied by the breakaway clip will not move the plunger from its at-rest position;
   the repetitive-switching clip being movable away from its engagement with the contact surface of the plunger when said external test force applied to the plunger exceeds said threshold level, said movement of the repetitive-switching clip away from the plunger contact surface allowing the plunger to travel in the barrel toward and into contact with the switch point on the terminal to produce a closed circuit condition in the electrical test circuit connected to the switch probe.

2. Apparatus according to claim 1 in which the repetitive-switching probe has a pair of fingers extending axially along the barrel and into contact with the contact surface of the plunger,, and in which the fingers of the repetitive-switching clip are spread apart to release the plunger for movement in response to the threshold force being applied to the fingers of the clip by the plunger.

3. Apparatus according to claim 1 in which the repetitive-switching probe has a pair of fingers extending into contact with the contact surface of the plunger, and in which the fingers of the repetitive-switching clip are spread apart to release the plunger for movement in response to the threshold force being applied to the fingers of the clip by the plunger.

4. Apparatus according to claim 1 including a return spring contained in the barrel and engaged with the plunger, the return spring being compressed only upon axial travel of the plunger in the barrel toward the contact point of the terminal.

5. Apparatus according to claim 1 in which the contact surface on the plunger comprises a cam surface, and in which the repetitive-switching clip has elongated fingers with cam followers on them, normally in spring pressure contact with the cam surface, so that a test force applied to the plunger causes the cam followers to ride on the cam surface until the threshold force is reached, at which point the cam followers released from contact with the cam surface to release the resistance force against the plunger, allowing the plunger to then travel in the barrel toward the switch point of the terminal.

6. Apparatus according to claim 1 in which the repetitive-switching clip is a separate device affixed to the barrel of the probe.

* * * * *

UNITED STATES PATENT AND TRADEMARK OFFICE
CERTIFICATE OF CORRECTION

PATENT NO. : 4,983,909
DATED : January 8, 1991
INVENTOR(S) : Mark A. Swart; Charles J. Johnston It is certified that error appears in the above-identified patent and that said Letters Patent is hereby corrected as shown below:

ON THE TITLE PAGE:

[56] References Cited, change "4,481,146" to -- 4,481,467 --.

Column 3, line 19, delete "switch".
Column 3, lines 25,28, delete "switch".

Column 4, line 45, change "12pounds" to -- 12 pounds --.
Column 4, line 46, delete "switch".

Column 5, line 36, delete "switch".
Column 5, line 55, delete "switch".

Column 6, line 48, delete "switch".

Column 7, line 45, change "prove" to -- probe --.

UNITED STATES PATENT AND TRADEMARK OFFICE
CERTIFICATE OF CORRECTION

PATENT NO. : 4,983,909

DATED : January 8, 1991

INVENTOR(S) : Mark A. Swart; Charles J. Johnston

It is certified that error appears in the above-identified patent and that said Letters Patent is hereby corrected as shown below:

Column 8, line 13, delete "switch".
Column 8, line 35, change "breakaway" to -- repetitive-switching --.

Signed and Sealed this

Eighth Day of September, 1992

*Attest:*

DOUGLAS B. COMER

*Attesting Officer*       *Acting Commissioner of Patents and Trademarks*